(12) United States Patent
Chiba et al.

(10) Patent No.: US 7,095,045 B2
(45) Date of Patent: Aug. 22, 2006

(54) SEMICONDUCTOR DEVICE AND MANUFACTURING METHOD THEREOF

(75) Inventors: Shuichi Chiba, Sagamihara (JP); Masahiko Ishiguri, Kawasaki (JP); Koichi Murata, Kawasaki (JP); Eiji Watanabe, Kawasaki (JP); Michiaki Tamagawa, Aizuwakamatsu (JP); Akira Satoh, Aizuwakamatsu (JP); Yasushi Toida, Aizuwakamatsu (JP); Kazuhiro Misawa, Aizuwakamatsu (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/998,182

(22) Filed: Nov. 29, 2004

(65) Prior Publication Data
US 2005/0151250 A1    Jul. 14, 2005

Related U.S. Application Data

(63) Continuation of application No. PCT/JP2002/006245, filed on Jun. 21, 2002.

(51) Int. Cl.
*H01L 23/58* (2006.01)
*H01L 29/10* (2006.01)

(52) U.S. Cl. .......... 257/48; 781/782; 781/737; 781/738; 438/11; 438/14; 438/613

(58) Field of Classification Search .......... 257/48, 257/781, 782, 784, 786, E23.179, E21.524; 438/14, 15, 18, 612, 613, 614; 228/180.22
See application file for complete search history.

(56) References Cited

U.S. PATENT DOCUMENTS

| 5,854,513 | A  | * | 12/1998 | Kim .......................... 257/737 |
| 6,150,727 | A  |   | 11/2000 | Takagi |
| 6,251,694 | B1 |   | 6/2001  | Liu et al. |
| 6,782,895 | B1 | * | 8/2004  | Van Nguyen et al. ...... 132/203 |
| 6,782,897 | B1 | * | 8/2004  | Wang et al. ................. 134/1.2 |

FOREIGN PATENT DOCUMENTS

| JP | 61-253847 | 11/1986 |
| JP | 1-295444  | 11/1989 |
| JP | 9-232392  | 9/1997  |
| JP | 11-67775  | 3/1999  |

OTHER PUBLICATIONS

European Patent Office Action dated Apr. 25, 2006, issued in corresponding European Patent Application No. 02738780.2.

* cited by examiner

*Primary Examiner*—Jasmine Clark
(74) *Attorney, Agent, or Firm*—Westerman, Hattori, Daniels & Adrian, LLP.

(57) ABSTRACT

A semiconductor device includes a substrate, a pad electrode formed on the substrate and a bump electrode formed on the pad electrode, wherein the pad electrode has an irregular flaw, and there is provided a pattern covering the irregular flaw between the pad electrode an the bump electrode.

15 Claims, 8 Drawing Sheets

FIG.16

SEMICONDUCTOR DEVICE AND MANUFACTURING METHOD THEREOF

CROSS-REFERENCE TO RELATED APPLICATIONS

The present invention is a continuation application filed under 35 U.S.C. 111(a) claiming benefit under 35 U.S.C. 120 and 365(c) of PCT application PCT/JP2002/006245 filed on Jun. 21, 2002, the entire contents of which are incorporated herein as reference.

BACKGROUND OF THE INVENTION

The present invention generally relates to semiconductor devices and more particularly to a pad electrode structure for use in semiconductor devices.

In semiconductor devices, it is necessary to form protrusion electrodes on pad electrodes for external connection, such that the pad electrodes, formed inside a semiconductor device on a semiconductor substrate, are connected to a substrate (such as interposer) used for mounting the semiconductor device thereon, electrically and also mechanically.

Generally, at the time of manufacture of semiconductor devices, it is necessary to ensure that each of the semiconductor devices shows electrically normal operation, upon completion of the manufacturing steps of the semiconductor device. For this purpose, it is practiced to carry out electric operational test by contacting a probe needle upon the pad electrodes formed on the semiconductor substrate.

In such operational test, it is necessary to press the probe needle against the pad electrode of Al or Cu, and thus, there is formed a flaw (hereinafter probe mark) on the surface of the pad electrode by the sharply pointed probe needle in such a manner that the surface of the pad electrode undergoes an irregular deformation.

Figure 1:
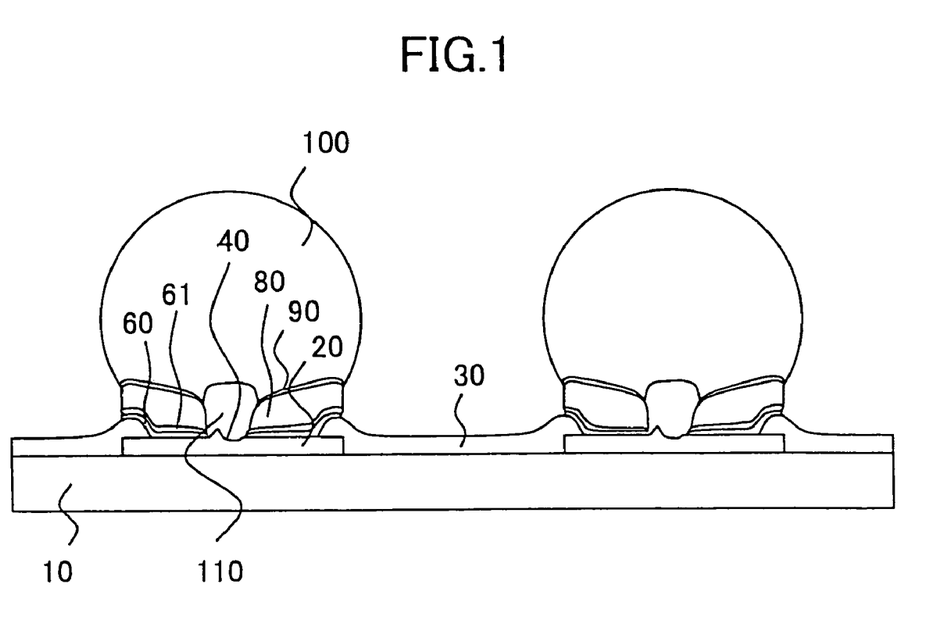
FIG. 1 is a diagram showing a semiconductor device for the case a bump is formed on a pad electrode carrying a probe flaw.

FIG. 1 is a diagram of the semiconductor device for the case a bump is formed on the pad electrode carrying such a probe mark.

Referring to FIG. 1, a pad electrode 20 is formed on a semiconductor substrate 10 and a passivation film 30 is formed such that the pad electrode 20 is exposed. Further, a probe mark 40 is formed on the surface of the pad electrode 20 as a result of the operational test.

On such a pad electrode 20, a Ti layer 60 and a Cu layer 61 are formed by a sputtering method respectively as an adhesion layer and a conductive layer, with respective thicknesses of 300 nm and 250 nm. Further, a Ni layer 80 and an Au layer 90 are formed respectively with the thicknesses of 4000 nm and 200 nm, by conducting an electrolytic plating process while using the conductive layer 61 as an electrode. It should be noted that the Au layer 90 functions as an oxidation prevention film of the Ni layer 80.

Further, a bump electrode 100 is formed on the Au layer 90 by a lead-free solder such as the solder of the Sn—Ag system or a lead solder such as the solder of the An—Pb system.

In the example of FIG. 1, it should be noted that there is formed a probe mark 40 on the pad electrode 20 as a result of the operational test as explained before, and because of this, there can be a case in which no uniform formation of the adhesion layer 60 or the Cu layer 61 is made by the sputtering process, because of existence of the irregularity forming the probe mark 40. Because the Ti layer 60 or the Cu layer 61 is very thin, having the thickness of only 200–300 nm, it is not possible to achieve uniform film formation in the case there exists projections and depressions in the underlying layer as in this case.

Thus, in the case a Ni layer 80 and an Au layer 90 are formed by an electrolytic plating process while using the Cu layer 61 as an electrode, there occurs no growth of these layers on the probe mark 40, and thus, there can be a case, in the event a bump 100 is formed on the foregoing Au layer 90, that a void 110 is formed between the pad electrode 20 and the bump 100 in correspondence to the probe mark 40.

When there exists such a void 110 underneath the bump electrode 100, there occurs degradation of electrical or mechanical properties in the junction that uses such a bump electrode, and the reliability of the semiconductor device is degraded. Further, there can occur a problem that the metal element such as An, Ag, Pb, Ni, and the like, forming the material of the bump electrode, cause diffusion into the pad electrode 20, or Al forming the pad electrode 20 cause diffusion into the bump electrode 100, via the region where no such a Ti layer or Cu layer is formed. Thereby, increase of contact resistance is invited.

Thus, in the prior art, it was not possible to achieve a contact of the probe electrode directly on the electrode pad surface, and it has been practiced to carry out the electric operational test by providing a separate electrode pad on the semiconductor device for probe test. In such an approach, however, there occurs an increase in the area of the semiconductor device in view of the need of providing such separate pad electrode for the probe test, in addition to the pad electrodes on which the bump electrodes are formed.

SUMMARY OF THE INVENTION

Accordingly, it is the concrete object of the present invention to provide a novel and useful manufacturing process of a semiconductor device wherein the foregoing problems are eliminated.

A more specific object of the present invention is to provide a semiconductor device allowing direct formation of a bump electrode on a pad electrode to which a probe needle has been contacted.

Another object of the present invention is to provide a semiconductor device comprising a substrate, a pad electrode formed on said substrate and a bump electrode formed on said pad electrode, said pad electrode having an irregular flaw, wherein there is provided a pattern covering said irregular flaw between said pad electrode and said bump electrode.

Another object of the present invention is to provide a manufacturing method of a semiconductor device, comprising the steps of:

forming a pad electrode on a substrate;

conducting a test by contacting a probe needle to said pad electrode;

forming a pattern on a part of a surface of said pad electrode so as to cover an irregular flaw formed thereon formed as a result of contact of said probe needle;

forming a conductive film on said surface of said pad electrode so as to cover said pattern;

forming a conductive foundation film on said pad electrode by an electrolytic plating process while using said conductive film as an electrode; and forming a bump electrode on said conductive foundation film.

Another object of the present invention is to provide a manufacturing method of a semiconductor device, comprising the steps of:

forming a pad electrode on a substrate;

conducting a test by contacting a probe needle to said pad electrode;

planarizing an irregular part formed as a result of contact of said probe needle;

forming a conductive film on said surface of said pad electrode so as to cover said planarized irregular part;

forming a conductive foundation film on said pad electrode by an electrolytic plating process while using said conductive film as an electrode; and forming a bump electrode on said conductive foundation film.

Another object of the present invention is to provide a manufacturing method of a semiconductor device, comprising the steps of:

forming a pad electrode on a substrate;

carrying out a test by contacting a probe needle to said pad electrode;

forming an electrode film on a front surface of said pad electrode so as to cover an irregularity formed as a result of contact of said probe needle;

forming a conductive foundation film on said pad electrode by an electrolytic plating process while using said electrode film as an electrode; and forming a bump electrode on said conductive foundation film, said electrode film having a thickness exceeding a step height of said irregularity.

According to the present invention, a conductive layer can be formed on said electrode pad including the part where the probe flaw is formed, by forming a protective film on the pad electrode where an irregular flaw (hereinafter a probe flaw) is formed by a probe needle used at the time of the probe testing or by planarizing the same. Thus, by forming a conductive pattern by conducting an electrolytic plating process while using such a conductive layer as an electrode, it becomes possible to form a bump electrode on the pad electrode. Thereby, the present invention eliminates the need of providing a separate pad electrode for testing, and the surface area of the semiconductor device is used efficiently. Further, the semiconductor device can be miniaturized.

Other features and advantages of the present invention will become apparent from the following detailed description about preferred embodiments made with reference to the drawings.

DETAILED DESCRIPTION OF THE PREFERRED EMBODIMENT

First Embodiment

FIGS. 2–10 show the process of manufacturing a semiconductor device according to a fist embodiment of the present invention.

A. Formation Step of Pad Electrode and Substrate Protection Film

Figure 2:
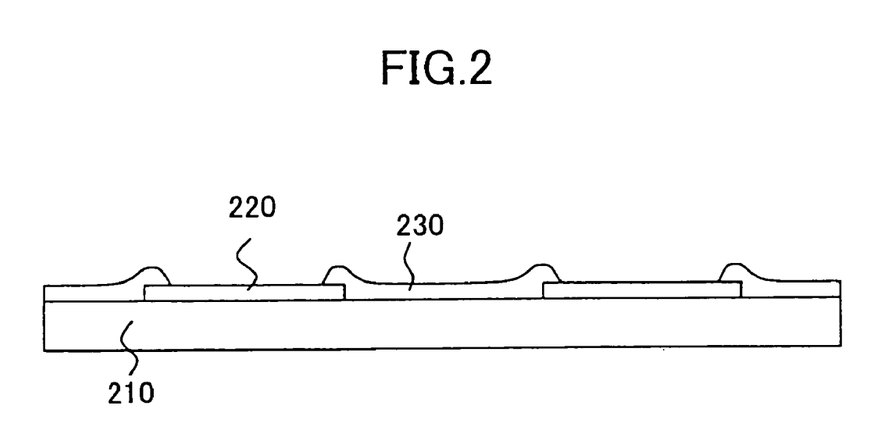
FIG. 2 is a diagram showing the process of bump formation on a pad electrode according to a first embodiment of the present invention.

Referring to FIG. 2, an aluminum film is formed on the peripheral part of a semiconductor substrate 210 formed with transistors and multilayer interconnections (not shown) by an electron beam evaporation deposition process or a sputtering process, and a pad electrode 220 is formed as a result of pattering of the same. Next, a silicon nitride film 230 is formed on the pad electrode 220 as a protective film so as to cover the pad electrode 220, and an opening is formed in the protective film 230 so that the pad electrode 220 is exposed.

B. Probe Test Step of the Semiconductor Device

Figure 3:
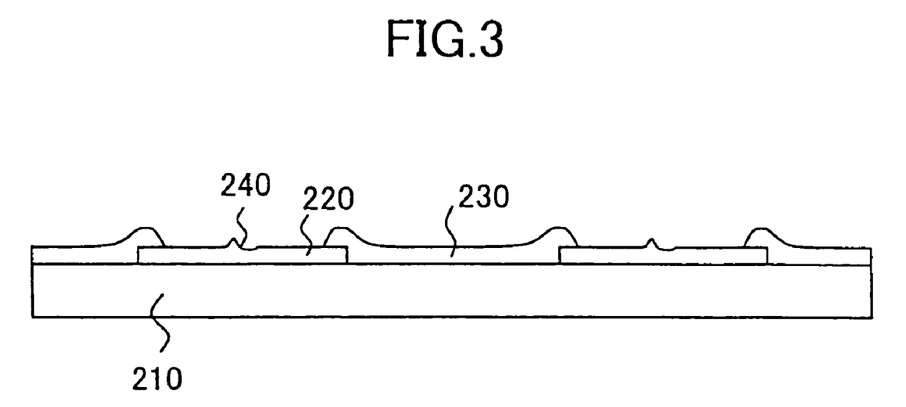
FIG. 3 is another diagram showing the process of bump formation on a pad electrode according to the first embodiment of the present invention.

After forming the structure shown in FIG. 2, the step of FIG. 3 is conducted and a probe test is carried out for confirmation of electric signals.

As a result, as shown in FIG. 3, there is formed a probe flaw 240 (referred to hereinafter as probe flaw) on the pad electrode 220 after the probe test in the form of a flaw of uneven shape as a result of urging of the probe needle thereto.

C. Silicon Nitride Film Formation Step on the Probe Flaw on the Pat Electrode Surface Further, in the step of FIG. 4, a film such as a silicon nitride film is formed on the structure of FIG. 3 so as to cover the probe flaw 240, and a silicon nitride film pattern 250 is formed in correspondence to the probe flaw 240 as a result of patterning of the silicon nitride film such that the silicon nitride film pattern 250 covers the probe flaw 240.

D. Formation Step of Ti Layer and Cu Layer

Figure 4:
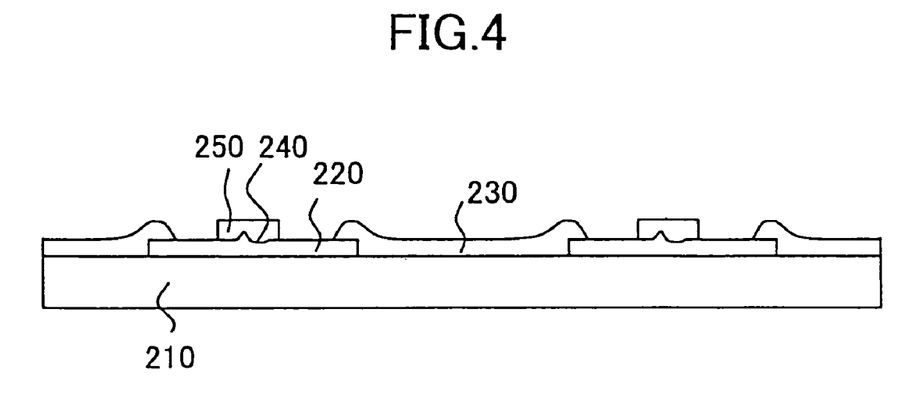
FIG. 4 is another diagram showing the process of bump formation on the pad electrode according to the first embodiment of the present invention.
Figure 5:
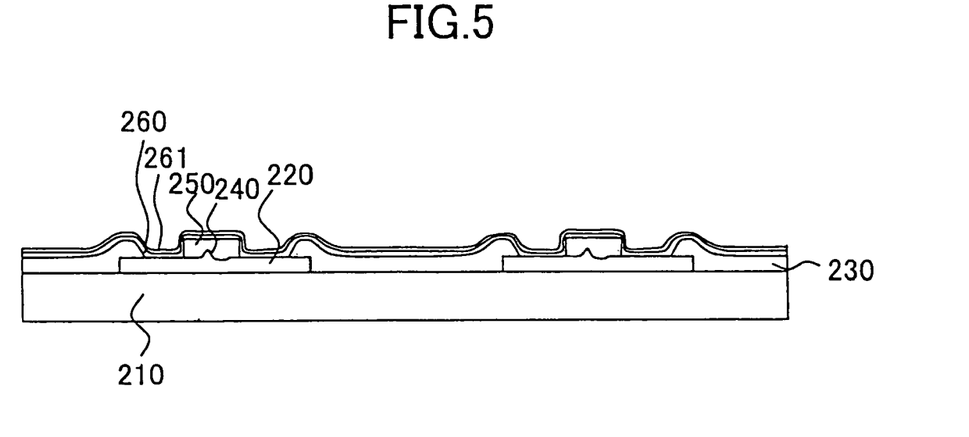
FIG. 5 is another diagram showing the process of bump formation on the pad electrode according to the first embodiment of the present invention.

Next, in the step of FIG. 5, a Ti layer 260 and a Cu layer 261 are formed consecutively on the structure of FIG. 4 so as to cover the pad electrode 220 and the silicon nitride pattern 250 by a sputtering process, with respective thicknesses of 300 nm and 200 nm.

E. Patterning Step of Resist Film

Figure 6:
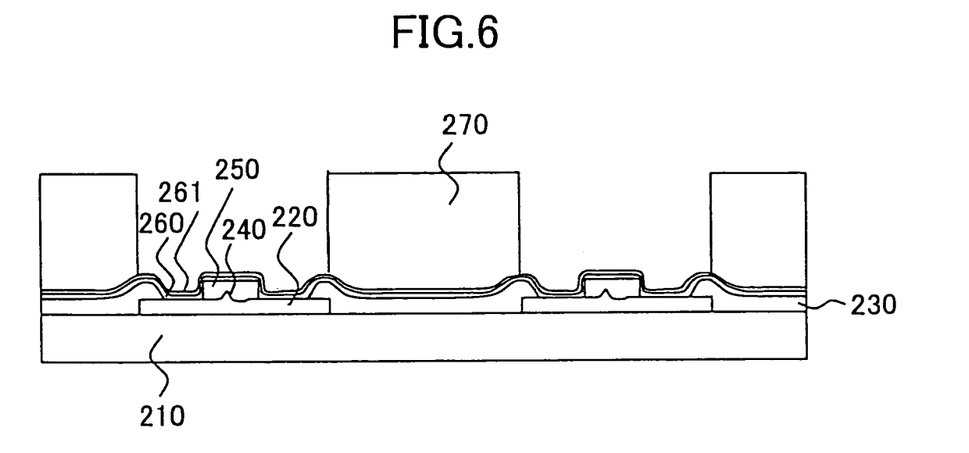
FIG. 6 is another diagram showing the process of bump formation on the pad electrode according to the first embodiment of the present invention.

Next, in the step of FIG. 6, a resist film 270 is formed on the structure of FIG. 5, and patterning of the resist film is made such that the resist film covers the region other than the pad electrode.

F. Formation Step of Ni Layer and Au Layer

Figure 7:
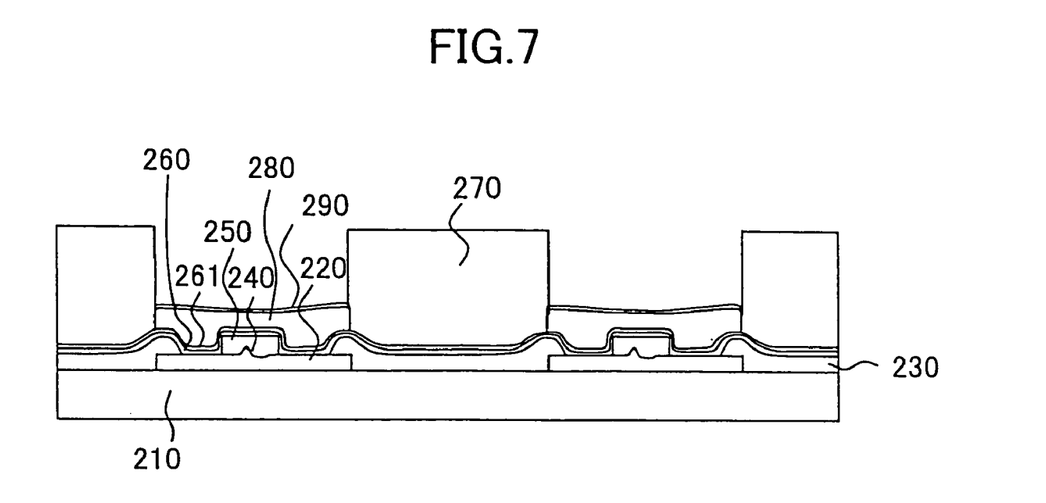
FIG. 7 is another diagram showing the process of bump formation on the pad electrode according to the first embodiment of the present invention.

Next, in the step of FIG. 7, a Ni layer 280 is formed on the structure of FIG. 6 by an electrolytic plating process with the thickness of 4000 nm, followed by formation of an Au layer 290 on the Ni layer 280 as an oxidation prevention layer with the thickness of 200 nm.

G. Removal Process of Resist Film

Figure 8:
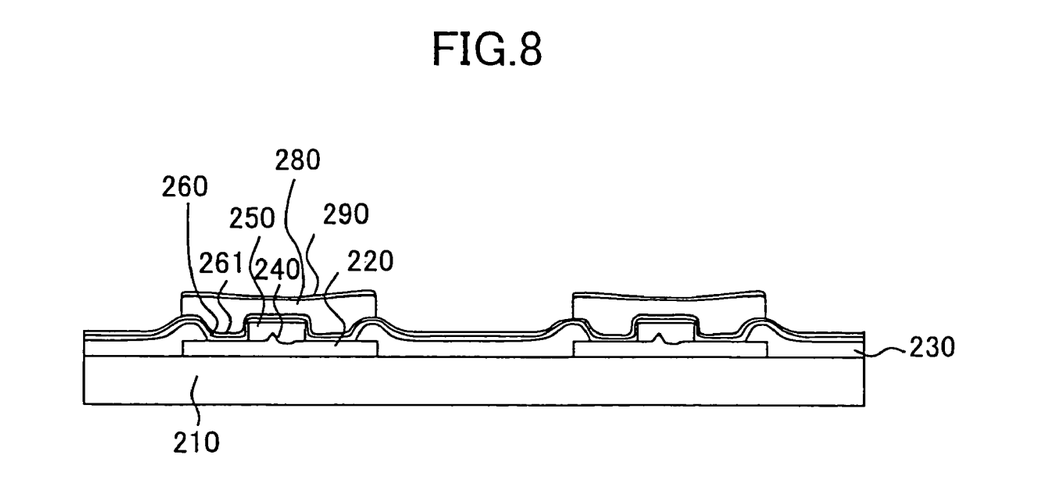
FIG. 8 is another diagram showing the process of bump formation on the pad electrode according to the first embodiment of the present invention.

Next, in the step of FIG. 8, ashing process is conducted and the resist film 270 of FIG. 7 is removed.

H. Etching Step of Ti Layer and Cu Layer

Figure 9:
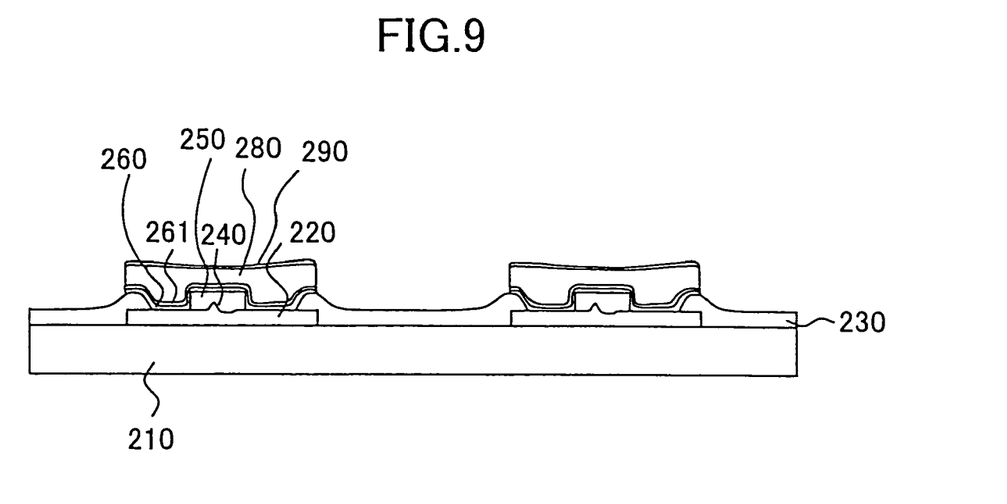
FIG. 9 is another diagram showing the process of bump formation on the pad electrode according to the first embodiment of the present invention.

Next, in the step of FIG. 9, the Ti layer 260 and the Cu layer 261 are removed except for the region of the pad electrode 220 by etching or ion milling while using the Ni layer 280 and the Au layer 290 formed on the pad electrode 220 as a mask.

I. Formation Step of Bump

Figure 10:
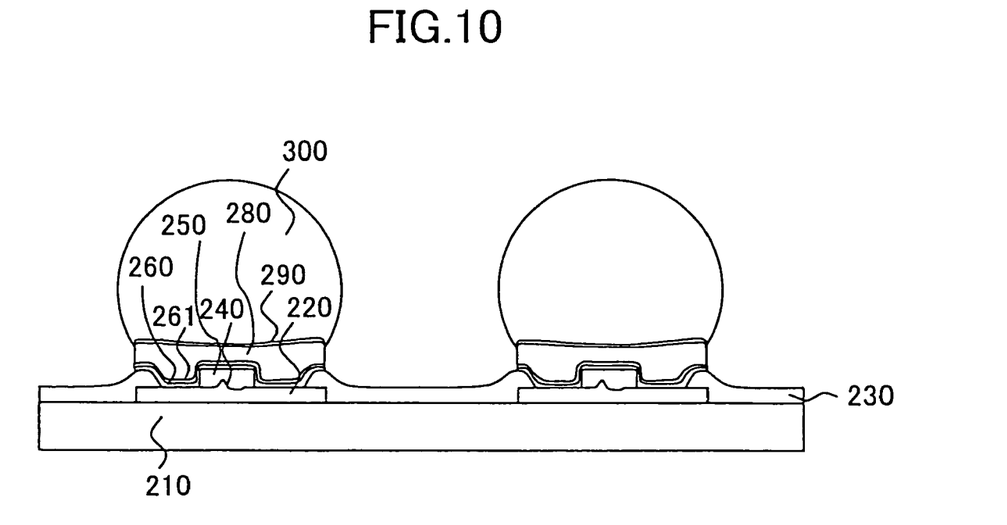
FIG. 10 is another diagram showing the process of bump formation on the pad electrode according to the first embodiment the present invention.

Further, in the step of FIG. 10, a leas-free solder of a Sn—Ag alloy or a lead solder of Sn—Pb alloy is formed on the Au layer 290 in the step of FIG. 10 by any of a printing method, transfer method or electrolytic plating method. Further, by conducting an annealing processing to the solder, a bump electrode 300 is formed.

In the present embodiment, on the other hand, it becomes possible to form the Ti layer 260 and the Cu layer 261 on the pad electrode 220 so as to cover the silicon nitride film pattern 250 continuously, by forming a protective film such as the silicon nitride film 250, which is an inorganic film, such that the protective film covers the probe flaw 240 on the surface of the pad electrode 220. Thereby, it is possible to form a Ni pattern 280 or an Au pattern 290 continuously on the pad electrode 220 by an electroplating process so as to cover the region corresponding to the pad electrode 220 uniformly. As a result of this, there occurs no void formation contrary to the conventional case, even when a bump electrode 300 is formed thereon. Such formation of the silicon nitride film 250 between the adhesion layer and the pad electrode 220 is extremely useful in the case the pad electrode 220 carries a flaw such as probe flaw.

It should be noted that, while description has been made in the present embodiment for the case the protective film pattern 250 is formed of an insulation film such as a silicon nitride film, the present invention is by no means limited to such a construction and it is also possible to use other insulation film such as a silicon oxide film or an organic film such as a polyimide film, or alternatively a conductive film of a metal or alloy, for the protective film pattern 250. For example, it is possible to obtain a similar effect by forming a conductive film of any of Ag, Pt, Pd and Cu in the form of paste, in place of the protective film pattern 250.

Second Embodiment

FIGS. 11–14 are diagrams showing the fabrication process of a semiconductor device according to a second embodiment of the present invention, wherein those parts corresponding to the parts described previously are designated by the same reference numerals and the description thereof will be omitted.

A. Probe Test Step of Semiconductor Device

Figure 11:
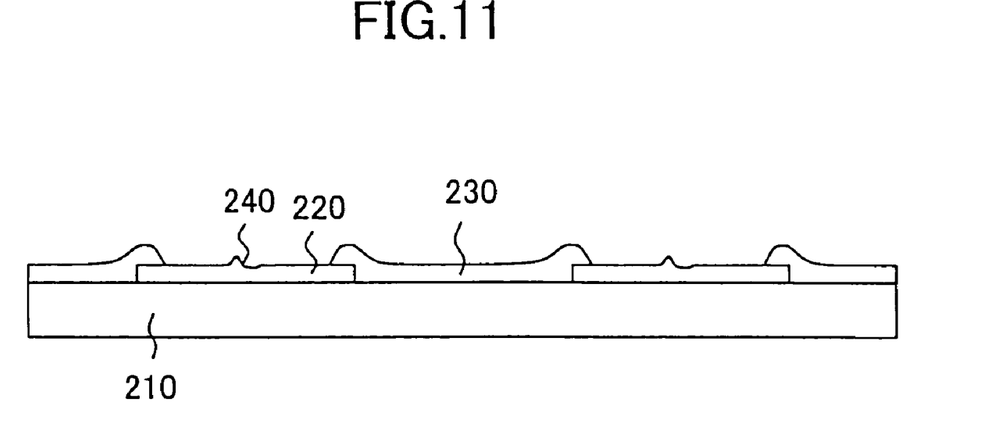
FIG. 11 is a diagram showing the process of bump formation on the pad electrode according to a second embodiment of the present invention.

As shown in FIG. 11, there is formed an irregular flaw on the surface of the pad electrode 220 as the probe flaw 240 on the semiconductor substrate 210, as a result of the probe test process conducted after formation of the pad electrode 220 and the substrate protection film 230.

B. Planarization Step of Probe Flaw by Dry Etching

Figure 12:
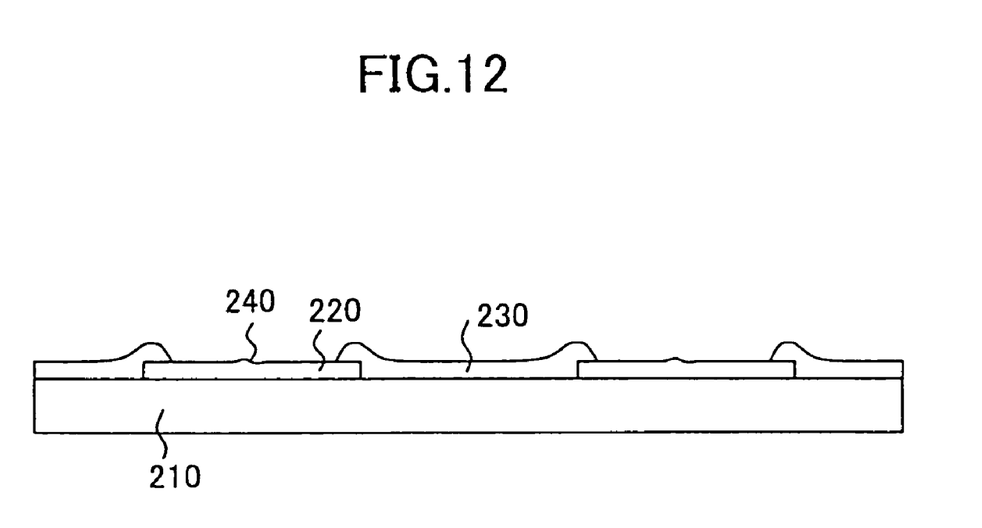
FIG. 12 is another diagram showing the process of bump formation on the pad electrode according to the second embodiment of the present invention.

Next, as shown in FIG. 12, a dry etching process is conducted at the surface of the pad electrode 220 so as to include the probe flaw 240, an the probe flaw 240 is planarized.

C. Formation Step of Ti Layer and Cu Layer

Figure 13:
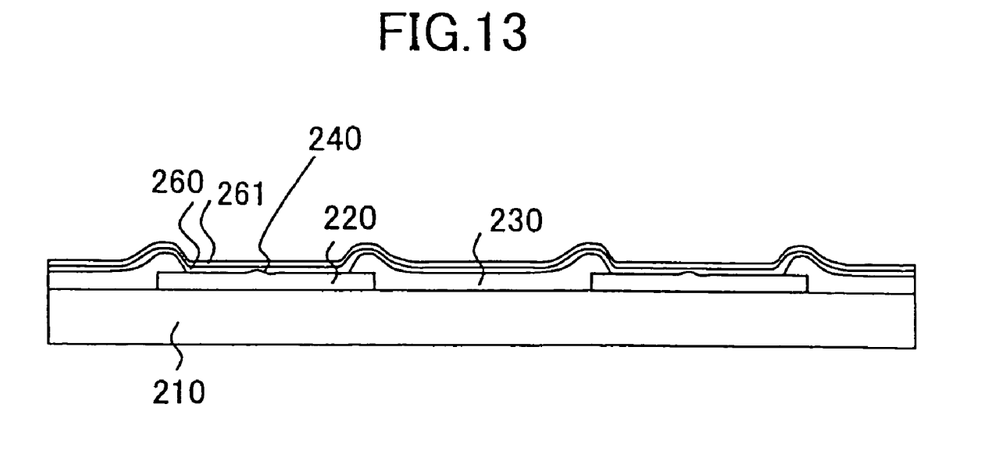
FIG. 13 is another diagram showing the process of bump formation on the pad electrode according to the second embodiment of the present invention.
Figure 14:
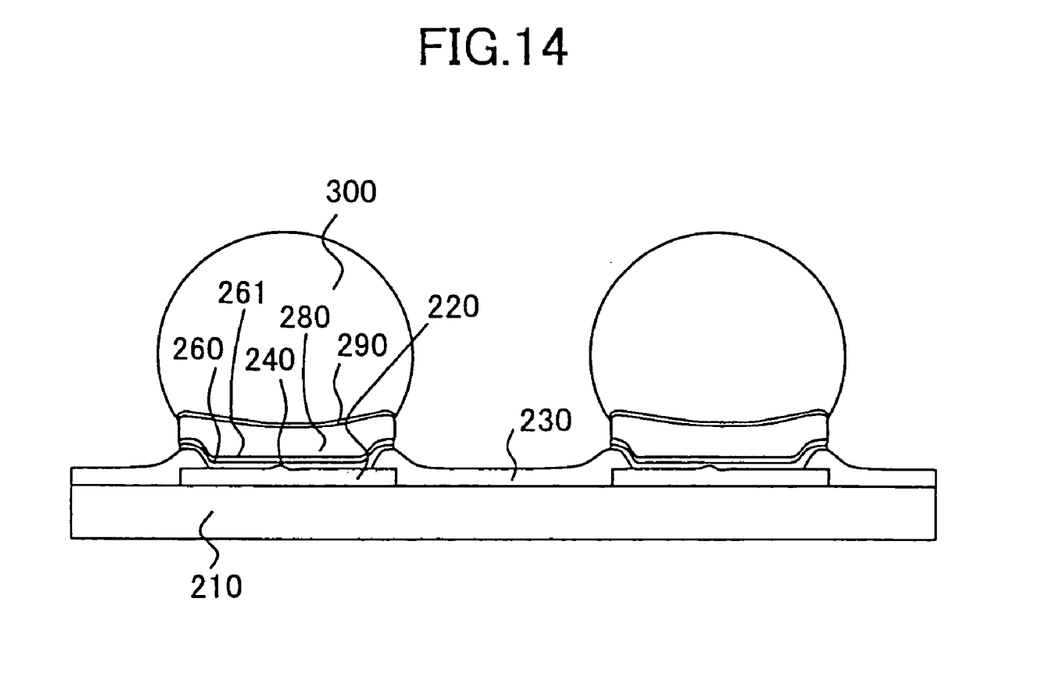
FIG. 14 is another diagram showing the process of bump formation on the pad electrode according to the second embodiment of the present invention.

Next, in the step of FIG. 13, the Ti layer 260 and the Cu layer 61 are formed on the structure of FIG. 12 consecutively by a sputtering process so as to cover the substrate protective film 230 and the pad electrode with respective thicknesses of 300 nm and 200 nm.

D. Formation Step of Bump

Thereafter, the steps of Embodiment 1 explained wit reference to FIGS. 6–9 is conducted, and the Ni layer 280 is formed on the Cu layer 261 on the pad electrode 220 with the thickness of 4000 nm and the Au layer 290 with the thickness of 200 nm. Further, a lead-free solder alloy of Sn—Ag system or a lead solder alloy of Sn—Pb system is formed, and the bump electrode 300 is formed by conducting an annealing process.

In this way, the present embodiment enables continuous and uniform formation of the Ti layer 260 and the Cu layer 261 on the pad electrode 220 continuously by planarizing the irregularity step of the probe flaw 240, and it becomes possible to form the bump electrode 300 without forming void.

In the present embodiment, the planarization of the probe flaw 240 has been conducted by dry etching. On the other hand, it is also possible to obtain a similar result by using a wet etching process in place of the dry etching process. Further, it is also possible to planarize the probe flaw 240 by fusing the pad electrode 220 at the temperature of 600–800° C. Further, it is possible to obtain a similar effect by applying a mechanical pressure to the probe flaw 240 in place of the dry etching process and thus conducting the planarization of the probe flaw 240 mechanically.

Third Embodiment

Figure 15:
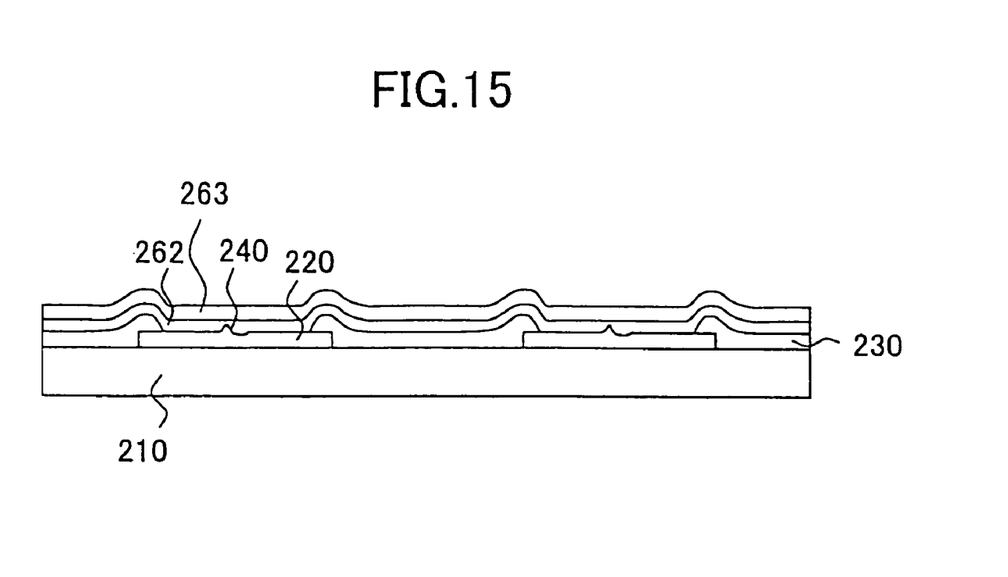
FIG. 15 is a diagram showing the process of bump formation on the pad electrode according to a third embodiment of the present invention.
Figure 16:
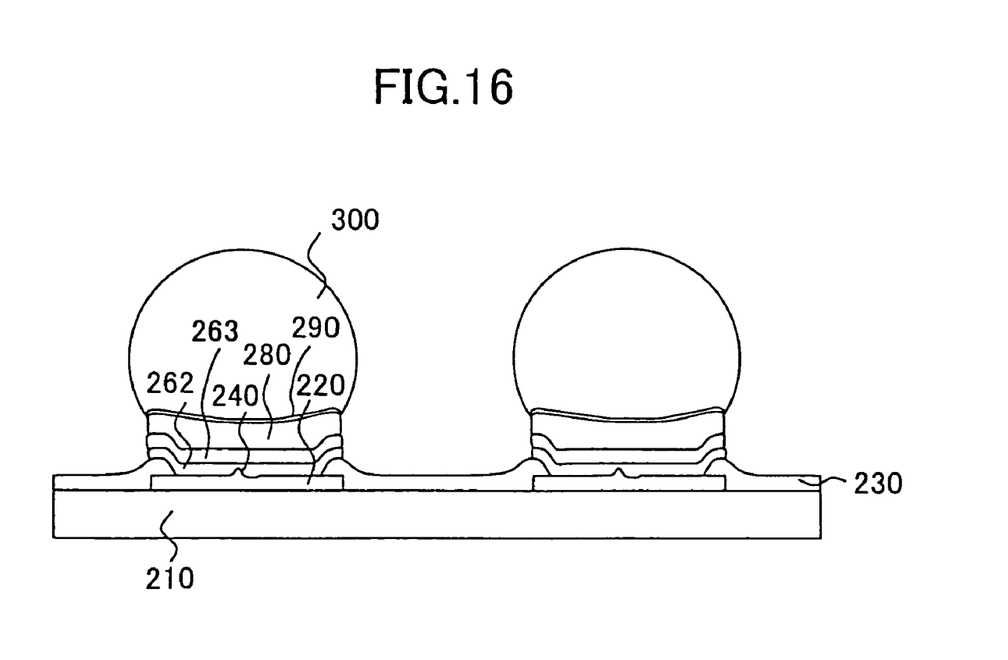
FIG. 16 is another diagram showing the process of bump formation on the pad electrode according to the third embodiment of the present invention.

FIGS. 15–16 are diagrams showing the manufacturing process of the semiconductor device according to a third embodiment of the present invention, wherein those parts in the drawing corresponding to those parts described previously are designated by the same reference numerals and the description thereof will be omitted.

Referring to FIG. 15, the present embodiment forms, after the probe test step, the Ti layer 262 and the Cu layer 263 by a sputtering process so as to cover the pad electrode 220 carrying thereon the probe flaw 240 and the passivation film 230, consecutively with a larger thickness of 500 nm, for example.

Thereafter, by conducting the process of

FIGS. 6–9 explained previously, the Ni layer 280 is formed on the Cu layer 263 on the pad electrode 220 with the thickness of 4000 nm and the Au layer with the thickness of 200 nm by an electrolytic plating process as shown in FIG. 16. Further, a lead-free solder alloy of the Sn—Ag system or the Pb alloy of the Sn—Pb system is formed. Further, by applying an annealing process to the solder alloy, the bump electrode 300 is formed.

In the present embodiment, the step height of the probe flaw 240 is relatively reduced or becomes ignorable, by forming the Ti layer 262 and the Cu layer 263 with a large thickness preferably equal to or larger than the step height of the probe flaw 240, such as the thickness of about 1am. With this, it becomes possible to form the Ti layer 262 and the Cu layer 263 continuously on the pad electrode 220.

In any of the foregoing embodiments, it should be noted that the adhesion layer 260 is not limited to a Ti layer but may be formed of any of Ti, Cr, TiW, Mo, Ta, W, Nb and V. Further, it should be noted that the electrode layer 261 is not limited to Cu but can be formed of any of Ni, Cu, Pd, Pt, Au and Ag. Further, the process of forming these is not limited to a sputtering process but evaporation deposition process or MOCVD process can also be used.

Further, the conductive layer 280 forming the foundation layer of the bump (UMB layer: under bump metal) is not limited to the Ni layer but may be formed of an alloy containing Ni and Cu. Further, the oxidation prevention layer 290 is not limited to Au but can be formed of any of Au, Pt, Pd and In.

Further, the bump electrode 300 is not limited to the Sn—Au alloy or Pb—Sn alloy but an alloy of Pd, Ni, Cu, Sn and Pb, or Au or Ag may also be employed.

Further, the present invention is not limited to the preferred embodiments described heretofore, but is subjected to various variations and modifications within the scope of the present invention set forth in patent claims.

INDUSTRIAL APPLICABILITY

According to the present invention, it becomes possible to form a conductive film on a pad electrode stably and continuously even when the pad electrode formed on a substrate carried thereon an irregular flaw. Thus, by conducting an electrolytic plating process while using such a conductive film as an electrode, it becomes possible to form a conductive layer on the front surface of the pad electrode. As a result, it becomes possible to form a bump electrode on such a conductive layer stably, without forming a void.

According to the present invention, it becomes possible to form a bump electrode also on the pad electrode to which the probe electrode is contacted. Thereby, the need of forming a separate pad electrode for testing is eliminated, and the substrate surface area can be used efficiently. Further, the semiconductor device can be miniaturized.

What is claimed is:

1. A semiconductor device comprising:
   a substrate;
   a pad electrode formed on said substrate; and
   a bump electrode formed on said pad electrode,
   wherein said pad electrode carries an irregular flaw, and a pattern is provided between said pad electrode and said bump electrode so as to cover said irregular flaw.

2. The semiconductor device as claimed in claim 1, wherein said pattern comprises an inorganic film.

3. The semiconductor device as claimed in claim 1, wherein said pattern comprises an organic film.

4. The semiconductor device as claimed in claim 1, wherein said pattern comprises a conductive film.

5. The semiconductor device as claimed in claim 1, wherein said pattern comprises a laminated film combining an inorganic film or an organic film or a conductive film.

6. A manufacturing method of a semiconductor device, comprising the steps of:
   forming a pad electrode on a substrate:;
   conducting a test by contacting a probe needle to said pad electrode;
   forming a pattern on a part of surface of said pad electrode so as to cover an irregularity formed by contact of said probe needle;
   forming a conductive film on said surface of said pad electrode so as to cover said pattern;
   forming a conductive foundation film on said pad electrode by an electrolytic plating process while using said conductive film as an electrode; and
   forming a bump electrode on said conductive foundation film.

7. The manufacturing method of a semiconductor device as claimed in claim 6, wherein said pattern is formed of an inorganic film of a silicon nitride film or a silicon oxide film.

8. The manufacturing method of a semiconductor device as claimed in claim 6, wherein said pattern is formed of an inorganic film of a polyimide film.

9. The manufacturing method of a semiconductor device as claimed in claim 6, wherein said pattern comprises a conductive film of Ag, Pt, Pd and Cu of a paste state.

10. A manufacturing method of a semiconductor device, comprising the steps of:
    forming a pad electrode on a substrate;
    conducting a test by contacting a probe needle to said pad electrode;
    planarizing irregularity formed by contact of said probe needle;
    forming a conductive film on a surface of said pad electrode so as to cover said planarized irregularity;
    forming a conductive foundation film on said pad electrode by an electrolytic plating process while using said conductive film as an electrode; and
    forming a bump electrode on said conductive foundation film.

11. The manufacturing method of a semiconductor device as claimed in claim 10 wherein said planarizing step comprises the step of dry etching said irregular flaw.

12. The manufacturing method of a semiconductor device as claimed in claim 10, wherein said planarizing step comprises the step of wet etching said irregular flaw.

13. The manufacturing method of a semiconductor device as claimed in claim 10, wherein said planarizing step comprises the step of fusing said pad electrode at 600–800 □.

14. The manufacturing method of a semiconductor device wherein said polarizing step comprises the step of applying a pressure mechanically to said irregular flaw.

15. A manufacturing method of a semiconductor device, comprising the steps of:
    forming a pad electrode on a substrate;
    conducting a test by contacting a probe needle to said pad electrode;

forming an electrode film on a front surface of said pad electrode so as to cover an irregularity formed by contact of said probe needle;

forming a conductive foundation film on said pad electrode by an electrolytic plating process while using said electrode film as an electrode; and forming a bump electrode an said conductive foundation film, wherein said electrode film has a thickness exceeding a step height caused by said irregularity.

* * * * *